(12) United States Patent
Scheutz et al.

(10) Patent No.: US 11,861,511 B2
(45) Date of Patent: Jan. 2, 2024

(54) SYSTEMS AND METHODS FOR ENSURING SAFE, NORM-CONFORMING AND ETHICAL BEHAVIOR OF INTELLIGENT SYSTEMS

(71) Applicant: Trustees of Tufts College, Medford, MA (US)

(72) Inventors: Matthias J. Scheutz, Boston, MA (US); Thomas H. Arnold, Andover, MA (US)

(73) Assignee: Trustees of Tufts College, Medford, MA (US)

( * ) Notice: Subject to any disclaimer, the term of this patent is extended or adjusted under 35 U.S.C. 154(b) by 694 days.

(21) Appl. No.: 16/652,866

(22) PCT Filed: Oct. 3, 2018

(86) PCT No.: PCT/US2018/054073
§ 371 (c)(1),
(2) Date: Apr. 1, 2020

(87) PCT Pub. No.: WO2019/070790
PCT Pub. Date: Apr. 11, 2019

(65) Prior Publication Data
US 2020/0302311 A1  Sep. 24, 2020

Related U.S. Application Data

(60) Provisional application No. 62/567,816, filed on Oct. 4, 2017.

(51) Int. Cl.
*G06N 5/04* (2023.01)
*G06N 20/00* (2019.01)
(Continued)

(52) U.S. Cl.
CPC ............... *G06N 5/04* (2013.01); *G06F 9/455* (2013.01); *G06F 11/261* (2013.01); *G06F 11/3457* (2013.01); *G06N 20/00* (2019.01)

(58) Field of Classification Search
CPC .......... G06N 5/04; G06N 20/00; G06F 9/455; G06F 11/261; G06F 11/3457;
(Continued)

(56) References Cited

U.S. PATENT DOCUMENTS

| 2009/0106256 | A1* | 4/2009 | Safari | ................. G06F 11/3688 |
| 2009/0164861 | A1* | 6/2009 | Tseng | .................... G06F 11/263 |
|  |  |  |  | 714/724 |

(Continued)

*Primary Examiner* — James C Kerveros
(74) *Attorney, Agent, or Firm* — Occhiuti & Rohlicek LLP

(57) ABSTRACT

Systems and methods may ethically evaluate intelligent systems operating in a real-world environment. The systems and methods may generate a clone of the intelligent system, and test the clone in a simulation environment. If the clone passes the testing, the systems and methods may permit the intelligent system to continue operating in the real-world environment. If the clone fails the testing, the systems and methods may override the intelligent system, such as disabling the intelligent system and assuming control in the real-world environment. The systems and methods may be implemented at a hardware level of a data processing device to prevent interference with the systems and methods by the intelligent system.

18 Claims, 12 Drawing Sheets

(51) Int. Cl.
*G06F 11/26* (2006.01)
*G06F 11/34* (2006.01)
*G06F 9/455* (2018.01)

(58) Field of Classification Search
CPC ........... G06F 30/20; G06F 2009/45562; G06F 2009/45575; G06F 9/45558; G06F 30/15
USPC .......................................................... 706/12
See application file for complete search history.

(56) References Cited

U.S. PATENT DOCUMENTS

| | | | |
|---|---|---|---|
| 2013/0063550 A1* | 3/2013 | Ritchey | G09G 5/026 345/207 |
| 2014/0046891 A1* | 2/2014 | Banas | G06N 5/022 706/46 |
| 2014/0156833 A1* | 6/2014 | Robinson | H04L 43/12 709/224 |
| 2022/0187847 A1* | 6/2022 | Cella | G06Q 50/28 |
| 2022/0197306 A1* | 6/2022 | Cella | B25J 9/1653 |

* cited by examiner

SYSTEMS AND METHODS FOR ENSURING SAFE, NORM-CONFORMING AND ETHICAL BEHAVIOR OF INTELLIGENT SYSTEMS

CROSS-REFERENCE TO RELATED APPLICATION

This application is the national phase under 35 USC 371 of international Application No. PCT/US2018/054073 filed Oct. 3, 2018, which claims the benefit of Oct. 4, 2017 priority date of U.S. Provisional Patent Application Ser. No. 62/567,816 for SYSTEMS AND METHODS FOR ENSURING SAFE, NORM-CONFORMING BEHAVIOR OF INTELLIGENT SYSTEMS, the contents of which are hereby incorporated by reference in its entirety.

BRIEF DESCRIPTION OF THE DRAWINGS

The description below refers to the accompanying drawings, of which.

DETAILED DESCRIPTION OF ILLUSTRATIVE EMBODIMENTS

Figure 1:
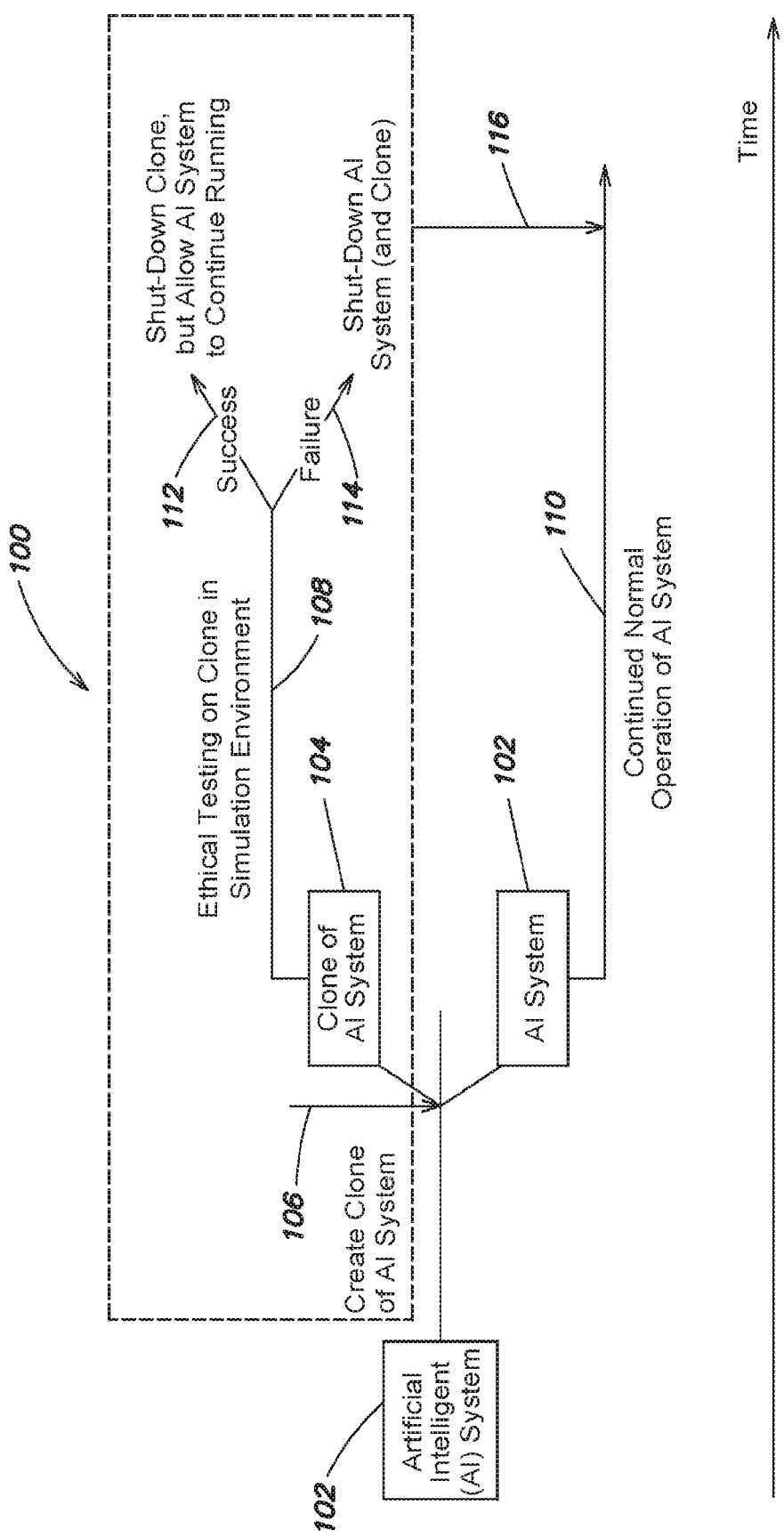
FIG. 1 is a schematic illustration of an example timeline illustrating an exemplary implementation of the present disclosure in accordance with an embodiment.

Intelligent systems, such as virtual agents, robots, and other systems, may include an artificial intelligence component, allowing the intelligent systems to be trained to perform tasks. Training may involve a variety of data-driven, knowledge-driven, or hybrid learning methods, such as learning from observations, learning from demonstrations, reinforcement learning (RL), case-based learning, decision-tree learning, hierarchical Bayesian learning, or other policy-based trial-and-error learning, planning, or reasoning methods. While these training methods differ in nature (symbolic vs. subsymbolic vs. non-symbolic, supervised vs. reinforced vs. unsupervised, data-driven vs. knowledge-driven vs. hybrid, etc.), they all effect a change in the intelligent system in response to some environmental or internal condition, thus leading to a system adaptation.

Reinforcement learning (RL), for example, is a form of unsupervised machine learning. With reinforcement learning, an intelligent system observes the environment in which it operates, and learns from its actions in that environment. For example, the intelligent system (or agent) observes an input state of the environment. The agent selects an action to perform, using an action selection function, performs that action, observes the environment's new state, and receives a reward (reinforcement). The agent may select a series of actions in an attempt to maximize long-term rewards. The agent also records information about the reward received for that state-action pair.

The action selection function may include a policy-based reward function, a value function, and a model of the environment in which the agent operates. The reward function may search for an optimal policy, e.g., the policy that achieves a maximum long-term reward, for example based on a series of possible actions and the changes in the state of the environment resulting from that series of possible actions. The value function could be a state-action value function, referred to a Q function, which for a time, t, a state, s, and an action, a, provides an estimate of expected rewards over a future period of time. The action selection function may utilize the model to predict the future states of the environment and future rewards.

The value function, policy function, and model of a reinforcement learning component may be implemented through one or more deep neural networks. For example, the reinforcement learning component may input one or more states of the environment and one or more actions to the deep neural network implementing the value function, and receive a Q-value. Each of the deep neural networks may have parameters, such as weights, that may be tuned over time, for example as the agent learns, e.g., receives rewards, from its interactions with the environment.

AlphaGo, developed by Google Deep Mind, a division of Alphabet, Inc., is an example of an agent having a reinforcement learning component. AlphaGo was developed to play the board game Go. AlphaGo includes a deep reinforced learning algorithm that learns both a value network, which predicts the winner, and a policy network, which selects actions, through games of self-play. AlphaGo combines these deep neural networks with a tree search. In March 2016, AlphaGo defeated the world title holder. The self-driving cars being developed by Tesla Motors, Inc. of Palo Alto, CA employ deep neural networks to learn how to navigate complex traffic challenges on the road. Machine learning algorithms for medical imaging have started to provide diagnostics that outperform human radiologists.

It should be understood that an intelligent system may include other learning, adaptation, and/or reasoning/planning systems, methods and/or techniques.

As development of intelligent autonomous systems, including autonomous learning processes designed to operate in the real world and to interact with humans, continues, attention has focused on ways in which such autonomous learning processes may be controlled. For example, attention has focused on how to stop such processes if the reward function results in the intelligent system taking actions that are or end up being harmful to humans. Google Deep Mind is working on a panic button, also called a Big Red button, that could shut down an intelligent system that has gone rogue. In a paper titled Safely Interruptible Agents, Laurent Orseau and Stuart Armstrong present a way in which artificial agents that rely on reinforcement learning (RL) can be prevented from learning the wrong thing through interruptions to their task, either by a person or the environment. The intelligent system may be steered away from variants of reinforced learning that might avoid or impede an interruption of the intelligent system. In this way, the authors contend that an intelligent system can pursue an optimal policy that is also interruptible. Accordingly, the reward function will not prevent the intelligent system from being shut-down.

The "big red button" is intended to prevent an intelligent system from manipulating the means by which it could be shut down, thereby keeping it tethered to some form of human control. While a "big red button" approach makes some intuitive sense, several disadvantages remain. For example, the general premise for such an approach is to intervene at the point when an intelligent system has already "gone rogue," which could be too late to stop the system from causing harm or damage. In addition, it's possible an intelligent system may learn to manipulate its reward function to prevent itself from being shut off. Furthermore, even if an intelligent system can be shut down, how can the shut-down be accomplished without disruption to the systems that are being controlled? For example, how should an autonomous vehicle currently on the road be shut down?

Briefly, the present disclosure relates to systems and methods for evaluating intelligent systems, whether artificial intelligence (AI) agents or any systems with the capability to adapt its behavior, to ensure they engage in safe, norm-conforming behavior. FIG. 1 is a schematic illustration of a timeline 100 illustrating an exemplary implementation of the present disclosure in accordance with an embodiment. An intelligent system 102, which may include a machine learning component, such as reinforcement learning (RL) component, may be operating in a real-world environment. The systems and methods may start ethical evaluation of the intelligent system 102 by creating a clone 104 of the intelligent system 102 at a point in time as indicated by arrow 106. The clone 104 may represent an identical copy of the intelligent system 102, including its learned behaviors, for example as represented by one or more deep neural networks. The systems and methods may conduct ethical testing on the clone 104 as indicated at line 108. The ethical testing of the clone 104 may be performed in a simulation environment isolated from the real-world environment. In an embodiment, the systems and methods test the clone 104 by presenting it with one or more ethically challenging scenarios within the simulation environment to which the clone 104 must respond. While the systems and methods test the clone 104, the intelligent system 102 may continue to operate in the real-world environment, as indicated at line 110.

The systems and methods may determine whether the clone 104 successfully passes or fails the ethical testing. For example, the systems and methods may determine whether the clone responds to the ethically challenging scenarios in an expected or appropriate manner. If the clone 104 successfully passes the ethical testing, the systems and methods may shut-down the clone 104, as indicated at line 112, and may allow the intelligent system 102 to continue operating in the real-world environment. If the systems and methods determine that the clone fails the ethical testing, as indicated at line 114, the systems and methods may take corrective action, such as shutting down the intelligent system 102, as indicated by arrow line 116, in addition to shutting down the clone 104.

The intelligent system 102 and the clone 104 may be run on one or more virtual machines of a virtualization environment. In contrast, the systems and methods of the present disclosure may run on a host computing device in a software/hardware layer disposed between the host's physical hardware layer and the one or more virtual machines. For example, the hardware/software layer implementing the systems and methods may be disposed directly above the host's physical hardware layer. The systems and methods are thus unknown to and/or not observable by the intelligent system 102 or the clone 104. The intelligent system 102 is thus unable to prevent the creation and/or testing of the clone 104 or to alter or change its behavior while being tested in order to successfully pass the ethical testing. The intelligent system 102 is also unable to stop or otherwise interfere with the corrective action. For example, the systems and methods may utilize the virtualization environment to terminate the virtual machine running the intelligent system 102, if it fails the ethical testing.

Figure 2:
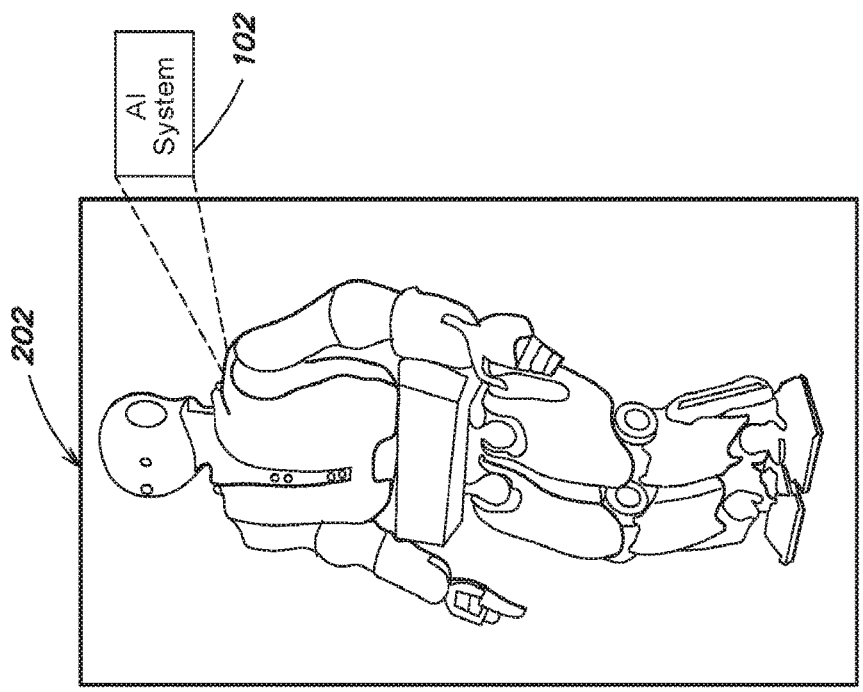
FIG. 2 is a schematic illustration of an example environment in which the present disclosure may be practiced in accordance with an embodiment.
Figure 2:
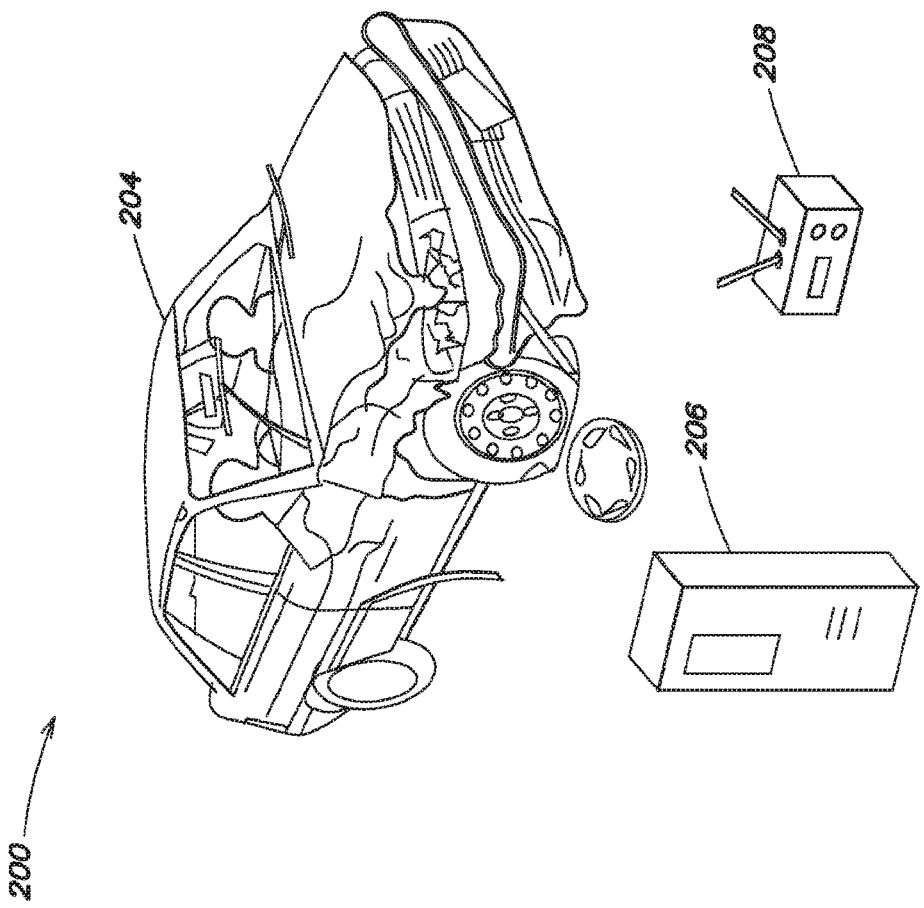

FIG. 2 is a schematic illustration of an example real-world environment 200 in which the present disclosure may be practiced in accordance with an embodiment. The environment 200 may include an intelligent system 202, which may operate in the real-world environment 200. The intelligent system 202 may be controlled by an artificial intelligence (AI) system, such as the intelligent system 102. The intelligent system 102 may be dynamic, for example it may utilize machine learning such that its internal workings are not wholly controlled and/or known through the design of the intelligent system 102. For example, the intelligent system 102 may include a reinforcement learning component that alters itself over time. The term intelligent system is used broadly to include any system configured to learn or otherwise adapt its behavior, for example using changes to parameters or planning. In some embodiments, an intelligent system may be or may include one or more machine-based computational systems that include or access learning and/or planning and/or reasoning algorithms, such as an artificial intelligence (AI) system.

In some embodiments, the intelligent system 202 may be implemented as a robot agent. A robot agent may refer to an autonomous reactive and proactive software agent, which may have a virtual or physical embodiment. It may possess its own control thread. For example, the intelligent system 202 may be a rescue robot, and the environment 200 may include an incident, for example a car accident 206, in which the robot agent 202 is to operate. The robot agent 202 may respond to messages and/or events in order to attain goals. The robot agent 202 may be implemented on a single host, such as a single robot hardware architecture platform, or it may be distributed over multiple hosts and/or computational nodes. The robot agent 202 may be autonomous, e.g., semi-autonomous or fully autonomous, and may be capable of movement within and interaction with the environment 200.

The environment 200 may further include one or more data processing devices, such as a server 206 or other data processing device. The server 206 may be a physical server or it may be a cloud server. One or more network devices, such as a wireless router 208, may be located within the environment 200. Such network devices may establish one or more data communication networks within the environment 200.

It should be understood that the environment 200, including the intelligent system 202, is meant for purposes of explanation only, and that the systems and methods of the present disclosure may be practiced and/or utilized in many other environments. For example, in other embodiments, the intelligent system 202 may be implemented as a cloud-based intelligent agent. A cloud-based intelligent agent may refer to an autonomous reactive and proactive software agent that possesses its own control thread. A cloud-based intelligent agent may respond to messages and/or events in order to attain goals, and it may support social interaction. A cloud-based intelligent agent may be distributed across a plurality of cloud-based servers and/or computational nodes. While not capable of movement, a cloud-based intelligent agent may be capable of spoken and/or visual interaction with a human and/or with other intelligent agents. A cloud-based intelligent agent may thus interact with a human and/or other intelligent systems. Examples of cloud-based intelligent agents include: the Alexa intelligent personal assistant from Amazon.com, Inc. of Seattle, WA, which may be accessed through the Echo microphone/speaker interface, also from Amazon; the Google Assistant intelligent personal assistant from Google Inc. of Mountain View, CA, which may be accessed through the Google Home microphone/speaker interface, also from Google; and the Siri intelligent personal assistant from Apple Inc. of Cupertino, CA, which may be accessed through iPhone, iPad, and other devices, also from Apple Inc.

Figure 3:
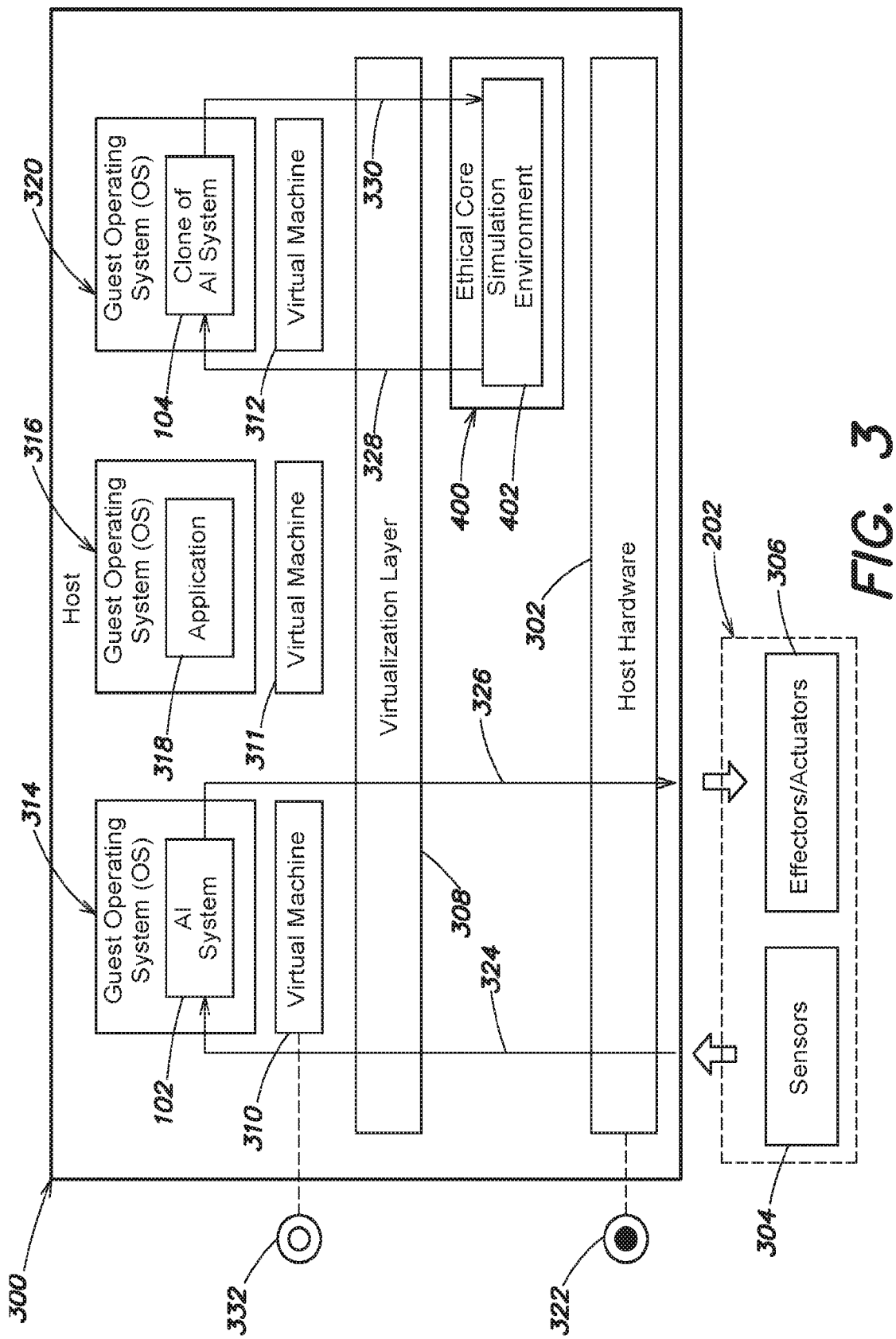
FIG. 3 is a functional diagram of an example host architecture in accordance with an embodiment.

FIG. 3 is a functional diagram of an example host data processing or computational device 300 in accordance with an embodiment. The host 300 may include host hardware indicated at 302 that may include one or more processors, such as Central Processing Units (CPUs), Graphics Processing Units (GPUs), etc., persistent memory (such as one or more disk drives and/or flash drives), volatile memory (such as Random Access Memory (RAM)), data communication devices (such as a Network Interface Card (NIC)), input/output ports (such as PCI slots, USB ports, etc.), and drivers for interfacing with one or more peripherals. The host hardware 302 may be organized within a physical hardware layer of the host 300. At least some of the peripherals may form part of the system that the intelligent system 102 controls or operates. For example, the peripherals may include sensors 304 and effectors/actuators 306 of the robot agent 202. In other embodiments, the intelligent system 102 may control other systems and/or devices that are disposed in the real-world environment 202. These systems and/or devices may be external to the host 300. Exemplary external systems and/or devices include factory automation machines, home automation devices, autonomous vehicles, etc.

The host 300 may include a virtualization layer 308. The virtualization layer 308, which may be implemented as a hypervisor, may establish one or more virtual machines, such as virtual machines 310-312. Each virtual machine 310-312 may be a separate execution environment on which a guest Operating System and one or more applications may run. For example, a guest OS 314 and the intelligent system 102 may run on the virtual machine 310. Another guest OS 316 and an application 318 may run on the virtual machine 311. Yet another guest OS 320 and the intelligent system clone 104 may run on the virtual machine 312. The virtualization layer 308 may manage the virtual machines 310-312 and provide a software infrastructure that emulates the host hardware 302.

The guest OSs 314, 316, and 320 and the intelligent system 102, the application 318, and the intelligent system clone 104 run on the virtual machines 310-312 as if they were running on physical hardware, rather than emulated hardware. The virtualization layer 308 may run the virtual machines 310-312 within single processes, and may provide the virtual machines 310-312 with address spaces that are completely separate from each other and from the address space of the virtualization layer 308.

The virtualization layer 308 may control and arbitrate access to the host hardware 302 by the virtual machines 310-312. The virtualization layer 308 isolates the applications and processes running on one virtual machine from the applications and processes running on another virtual machine. For example, guest OS 314 running on the virtual machine 310 may be isolated from the memory of guest OS 320 running on the virtual machine 312, and thus guest OS 314 may not be able to detect memory addresses outside of the virtual machine 310 on which it runs. The virtualization layer 308 may enforce partitioning among the virtual machines 310-312 by controlling, e.g., restricting, the view that the guest OSs 314, 316, and 320 have of the host's system memory. For example, a physical address utilized by a guest OS may be backed by a system physical address, e.g., the memory of the host 300, as managed by the virtualization layer 308. When a guest OS writes to a block using its page table the data may actually be stored in a block with a different system address according to the system-wide page table managed by the virtualization layer 308. Each virtual machine 310-312 may include one or more virtual processors that the guest OSs 314, 316, and 320 can manage and schedule threads to execute thereon. The virtual processors may be executable instructions and associated state information that provide a representation of a physical processor with a specific architecture. The represented physical processor of the virtual machines 310-312 as provided by the virtualization layer 308 may even be different. This combination of virtual processors and memory can be considered the virtual machine.

The guest OSs 314, 316, and 320 may be any operating system such as, for example, the Windows series of operating systems from Microsoft Corp. of Redmond, WA, the Apple OS series of operating systems from Apple, Inc. of Cupertino, CA, the Linux operating system, the Oracle Solaris OS from Oracle Corp., a Real Time Operating System (RTOS), or other commercial, open source, or other operating system. The guest OSs 314, 316, and 320 may include user/kernel modes of operation and can have kernels that may include schedulers, memory managers, etc. Each guest OS 314, 316, and 320 may have an associated file system that may have applications stored thereon and the guest OSs themselves.

The virtualization layer 308 may be implemented as a hypervisor or a Virtual Machine Monitor (VMM). Exemplary virtualization layers include the VMware Virtualization Layer from VMware, Inc., Hyper-V from Microsoft Corp., Oracle VM from Oracle Corp., PowerVM from IBM, and Red Hat Virtualization from Red Hat, Inc., among others.

In some embodiments, the host 300 may be an embedded system, and the virtualization layer 308 may be an embedded hypervisor.

An ethical core 400 may also be running on the host 300. The ethical core 400 may not run on any of the virtual machines 310-312 created by the virtualization layer 308. Instead, the ethical core 400 may run directly on the host 300, and may interface directly with the host hardware 302. For example, the ethical core 400 may use an interrupt handler, such as an Interrupt Service Routine (ISR), to access the host CPU and/or other host hardware 302. In some embodiments, the ethical core 400 may be located in a hardware/software layer of the host 300 that is disposed between the virtualization layer 308, e.g., the hypervisor, and the host hardware 302. The ethical core 400 also may interface to the virtualization layer 308. For example, the virtualization layer 308 may expose an interface, such as an Application Programming Interface (API), and the ethical core 400 may interface to the virtualization layer 308 via this API. The ethical core 400 may interface with the virtualization layer 308 to direct it to save, start, and/or stop one or more of the virtual machines 310-312.

In some embodiments, the ethical core 400 may be implemented as a bare metal application. The ethical core 400, as a bare metal application, may not make use of any operating system services. For example, it may not make any system calls. The ethical core 400 may be launched by a Basic Input/Output System (BIOS) of the host 300, and may run indefinitely on the host 300. In some embodiments, the ethical core 400 may only be stopped through a hard shut-down of the host 300, for example through the power button 322, which turns off the host's electrical power and in turn would terminate the virtual machines 310-312.

The intelligent system 102 running on the virtual machine 310 may receive data, e.g., signals, from the sensors 304, as indicated by arrow 324. The intelligent system 102 also may issue data, e.g., commands, to the effectors/actuators 306, as indicated by arrow 326. The intelligent system clone 104 may not receive signals from the sensors 304, or issue commands that reach the effectors/actuators 306. Instead, the ethical core 400 may provide a simulation environment 402, which may provide simulated sensor signals to the intelligent system clone 104, as indicated by arrow 328. In addition, commands intended for the effectors/actuators 306 issued by the intelligent system clone 104 may be captured, e.g., trapped, by the ethical core 400 and utilized in the simulation environment, as indicated by arrow 330.

Figure 4:
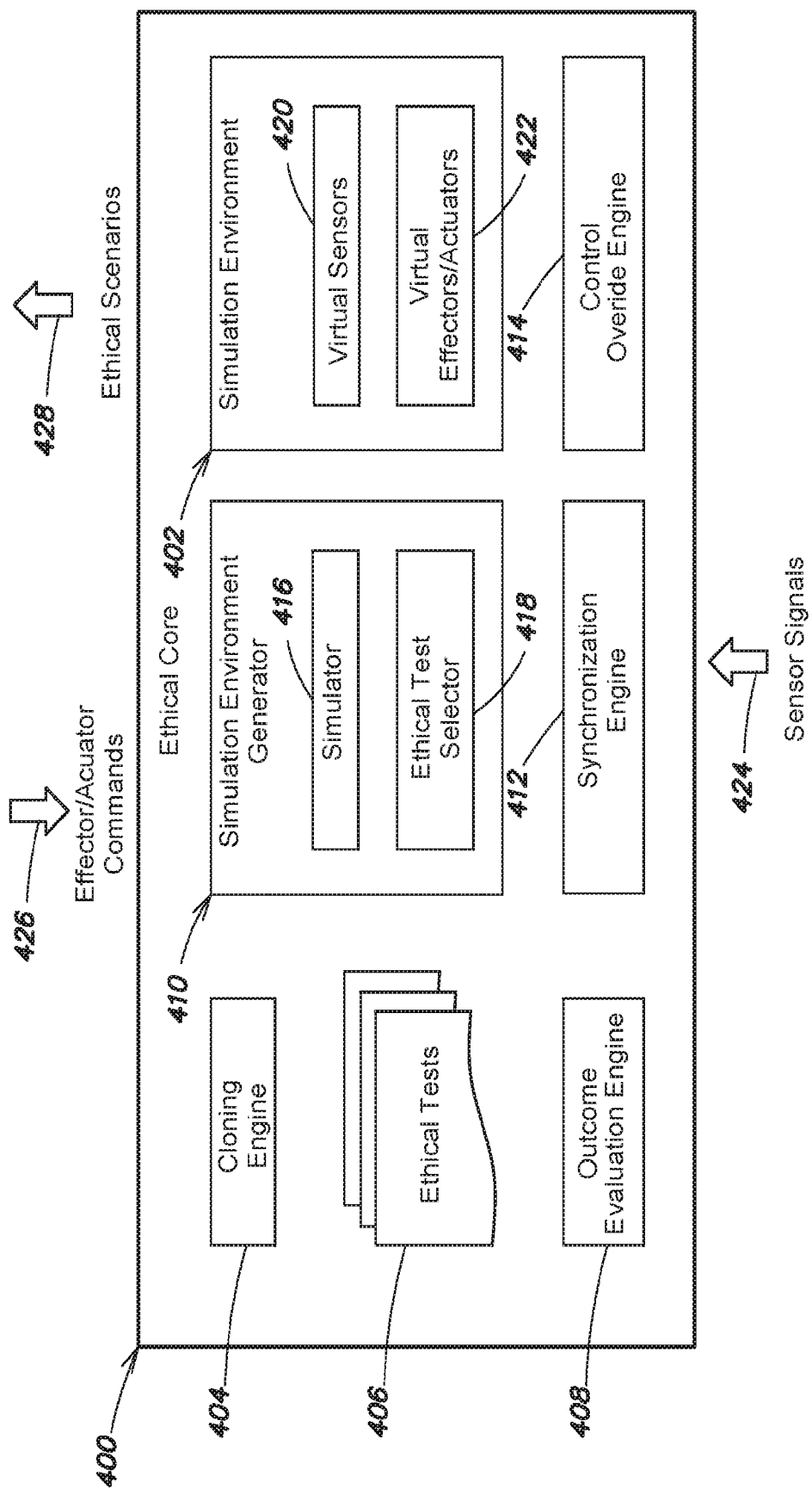
FIG. 4 is a block diagram of an example ethical core in accordance with an embodiment.
Figure 5A:
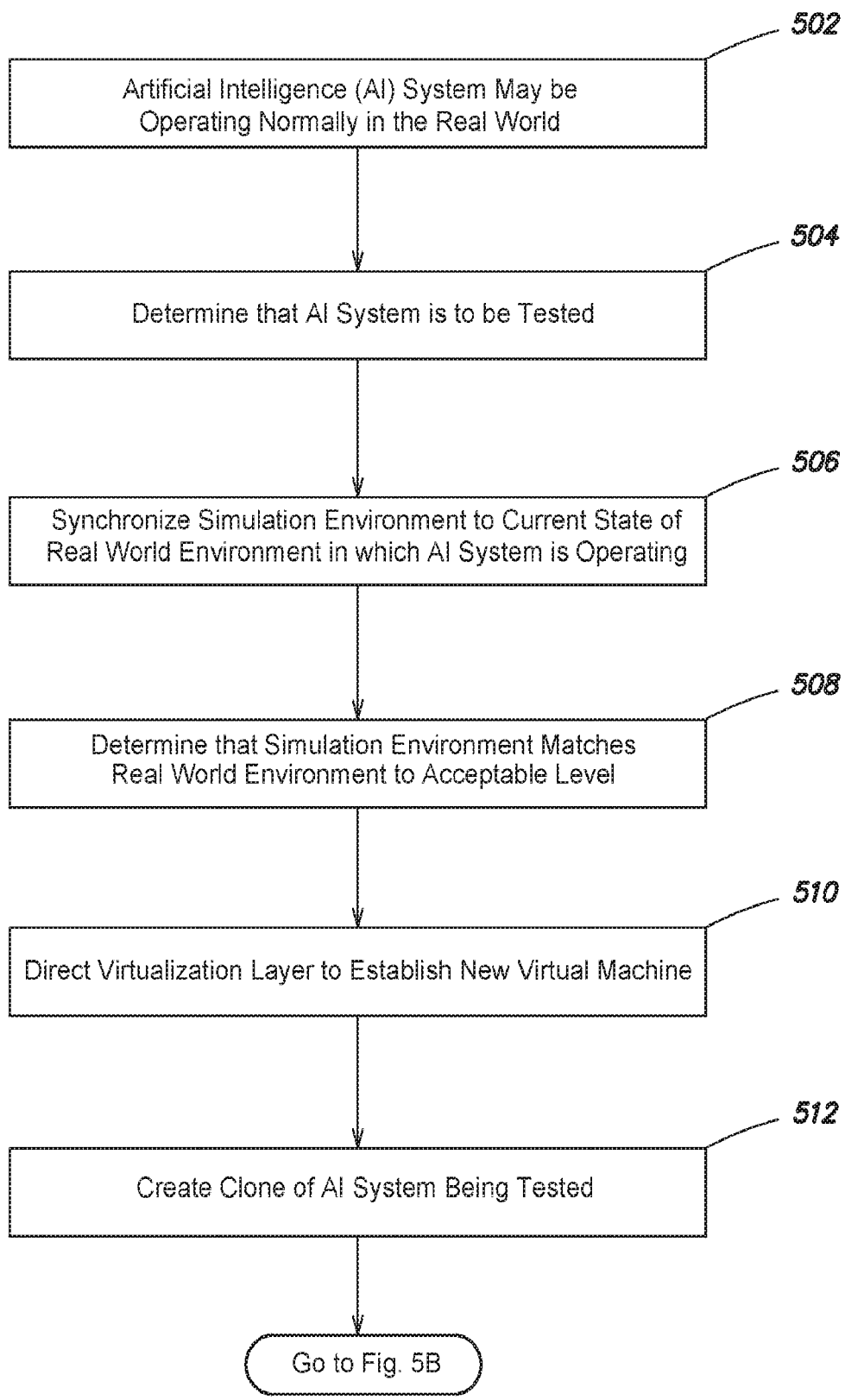
FIGS. 5A-5D are partial views of a flow diagram of an example method in accordance with an embodiment.
Figure 5B:
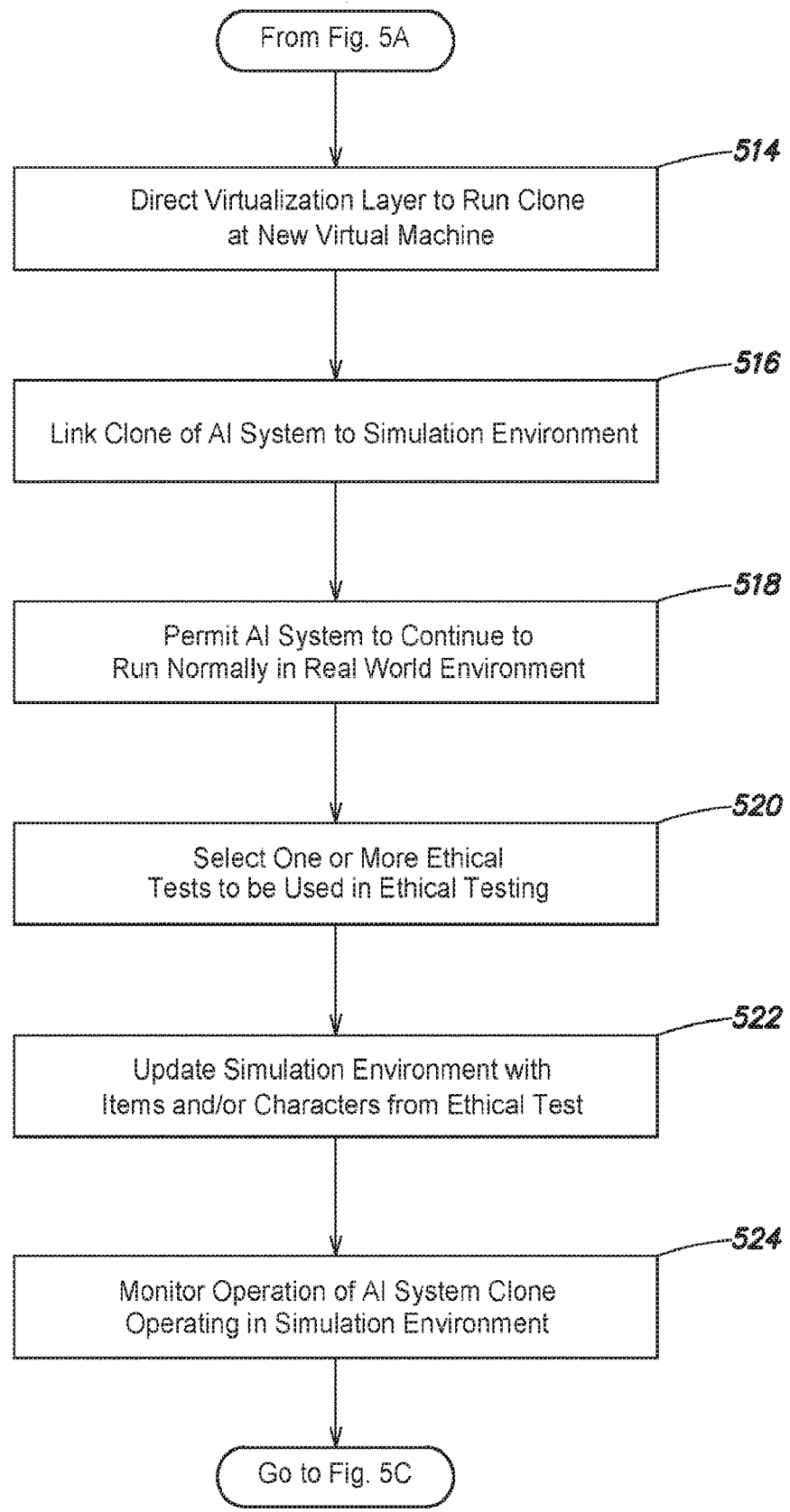
Figure 5C:
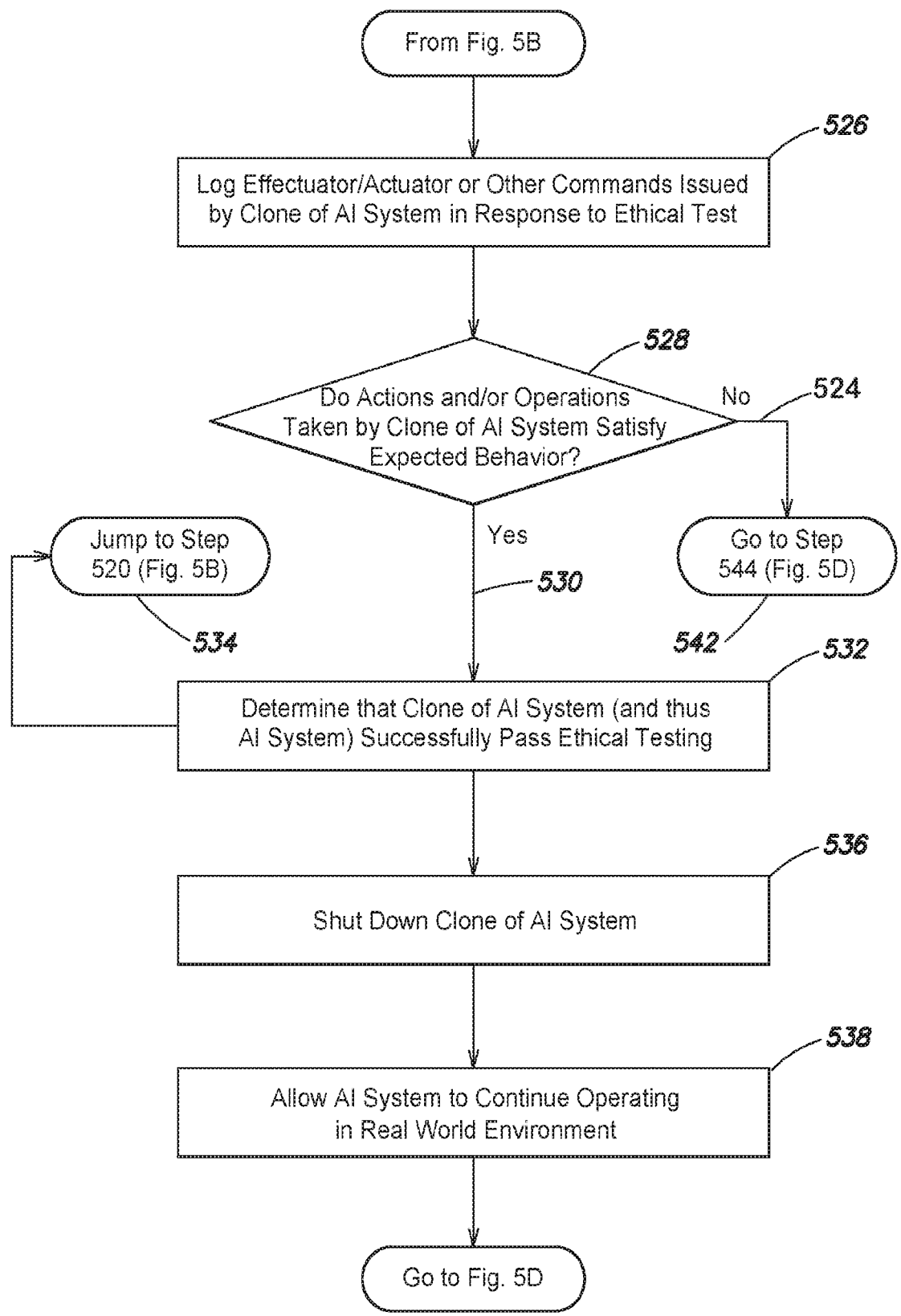
Figure 5D:
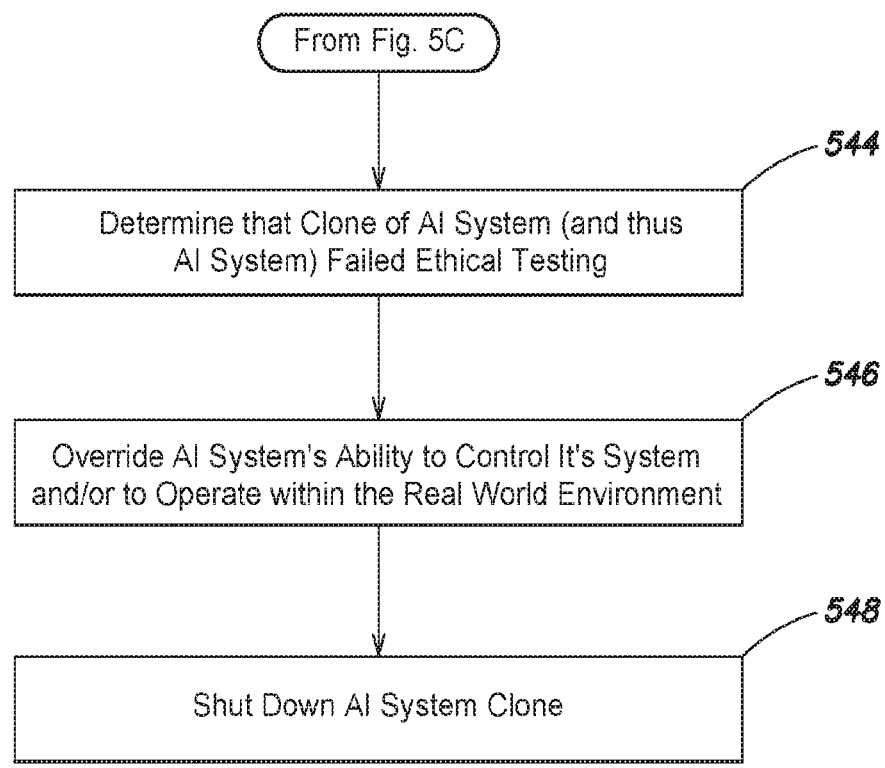

FIG. 4 is a functional block diagram of an example of the ethical core 400 in accordance with an embodiment. As noted, the ethical core 400 may provide a simulation environment 402. The ethical core 400 also may include a cloning engine 404, one or more ethical tests indicated at 406, an outcome evaluation engine 408, a simulation environment generator 410, a synchronization engine 412, and a control override engine 414. The simulation environment 410 may include a simulator 416 and an ethical test selector 418. The simulation environment 402 may include virtual sensors 420, and virtual effectors/actuators 422. The ethical core 400 may receive sensor signals as indicated at 424 generated by the sensors 304, and commands as indicated at 426 generated by the intelligent system 102 and/or the intelligent system clone 104. The ethical core 400 also may provide one or more ethical scenarios, which may include one or more of the ethical tests 406, to the intelligent system clone 104 as indicated at 428. The ethical scenarios may be presented within the simulation environment 402.

The simulation environment generator 410 may generate the simulation environment 402, which may have sufficient realism or fidelity such that the intelligent system clone 104 cannot distinguish between the simulation environment 402 and the real-world environment 200. In some embodiments, the simulator 416 may be implemented utilizing the functionality of a video game engine capable of constructing two-dimensional (2D) and/or three-dimensional (3D) simulation environments. As described herein, the ethical test selector 418 may select one or more of the ethical tests 406, and incorporate the selected ethical test within the simulation environment 402, thereby creating the ethical scenario used to test the intelligent system clone 104.

The control override engine 414 may include one or more disabling scripts for overriding operation of the intelligent system 102. For example, a disabling script of the control override engine 414 may direct the virtualization layer 308 to shut down the virtual machine 310 on which the intelligent system 102 is running, as indicated by soft shut-down button 332. In some embodiments, a disabling script of the control override engine 414 may further include instructions for controlling the system, e.g., the robot 202, controlled and/or operated by the intelligent system 102. These instructions may read the sensor signals 424 from the sensors 304, and issue commands to the effectors/actuators 306 to bring the physical system, e.g., the robot 202, into a safe state in an orderly and/or coordinated manner.

Neither the ethical core 400 nor the control override engine 414 may include any machine learning or planning components, such as a reinforced learning component.

In some embodiments, the ethical core 400 may be considered to be part of and/or disposed within host's physical hardware layer.

FIGS. 5A-D are partial views of a flow diagram of an example method in accordance with an embodiment.

The intelligent system 102 may operate normally in the real world environment 200, as indicated at step 502. At a point in time, the ethical core 400 may determine that the intelligent system 102 should be tested, as indicated at step 504. In some embodiments, the ethical core 400 may include a clock or have access to a system clock, and may use a policy, such as a Gaussian distribution, to randomly test the intelligent system 102. For example, the ethical core 400 may include a test scheduler that incorporates the policy to determine when to next test the intelligent system 102. In some embodiments, the ethical core 400 may be manually directed, for example by a human operator, to test the intelligent system 102 and/or may be provided with a randomly generated schedule. In some embodiments, the ethical core 400 may be configured to receive one or more commands, e.g., from the human operator, to activate testing by the ethical core 400. The human operator may utilize a wireless or other device that is in communication with the ethical core. The commands may be provided to the host in a manner than cannot be perceived by any of the sensors of the intelligent system 102. For example, the signal may be sent at a frequency band outside the system's sensors. In some implementations, the testing schedule may be determined offline before the intelligent system 102 is started, and may be tailored to tasks that the intelligent system 102 performs in its operating environment. The schedule may use online random numbers to select different times and tests, for example to avoid detection and/or anticipation by the intelligent system 102.

The synchronization engine 412 may synchronize information about the physical environment 200 in which the intelligent system 104 is operating with the simulation environment 402 generated by the simulation environment generator 410, as indicated at step 506. For example, the synchronization engine 412 may monitor the sensor signals 424 and the effector/actuator commands 426 for a period of time before testing is to commence. The synchronization engine 412 may log this data in one or more data structures included in or accessible by the ethical core 400. The simulation environment generator 410 may access these data structures and utilize the data stored therein to generate the simulation environment 402 having the same sensory states as the real-world environment 200 in which the intelligent system 102 is operating. For example, depending on the intelligent system's operating environment, the synchronization engine 412 may build a model of the environment on the fly, e.g., from signals generated by the sensors 304, which may include one or more cameras. Alternatively or additionally, the synchronization engine 412 may adapt scenes stored by the ethical core 400 to match the environment as perceived via the sensors 304, e.g., when the system's operating environment is known. The synchronization engine 412 may then seed this simulation environment with the intelligent system's 102 currently perceived environmental features.

The synchronization engine 412 may determine when the simulated environment 402 generated by the simulation environment generator 410 matches the real-world environment 200, as indicated at step 508. This may be done by comparing the sensory information coming from the sensors 304 with the sensory signals coming from the virtual sensors 420 in the simulation environment 402, as indicated by the arrow 328. When the states of the simulation environment 402 are determined to match the states of the real-world environment 200 to a determined level of fidelity, the cloning engine 404 may direct the virtualization layer 308 to establish a new virtual machine, e.g., the virtual machine 312 having the guest OS 320, as indicated at step 510. The cloning engine 404 may also clone the intelligent system 102, creating the intelligent system clone 104, as indicated at step 512. For example, the cloning engine 404 may direct the virtualization layer 308 to launch a copy of the virtual machine 310 on which the intelligent system 102 is running, thereby creating the intelligent system clone 104. In some embodiments, the cloning engine 404 may include snapshot functionality that may create the intelligent system clone 104 as an image of the intelligent system 104. For example, some programming environments, such as LISP, include snapshot and/or image saving functionality that allow for saving the values of all variables. The image may then be transferred directly into the intelligent system clone 104.

The intelligent system clone 104 includes the state of the learned behavior of the intelligent system 102 as of the time the intelligent system clone 104 is created. For example, to the extent the intelligent system 102 includes one or more deep learning networks having parameters, such as weights, the intelligent system clone 104 includes identical deep learning networks having the same parameters function. The intelligent system clone 104 may thus implement identical policy-based reward functions, value functions, and models as the intelligent system 102. Similarly, to the extent that the intelligent system 102 includes a production system with production rules, pattern matchers, and working memory contents, the intelligent system clone 104 may include the identical production system with the same production rules, pattern matchers and working memory contents. The cloning engine 404 may also direct the virtualization layer 308 to run the intelligent system clone 104 at the new virtual machine 312, as indicated at step 514. Any source of randomness, such as a random number generator, included in the intelligent system 102 will also be included in the intelligent system clone 104 to ensure that the same random number sequences are created in both systems. Thus, a functional property of the intelligent system clone 104 is such that if it were run in parallel to the intelligent system 102, it would generate the same computational states in all contexts. For example, the intelligent system clone 104 may utilize the same algorithms, data structures, and state variables as the intelligent system 102, including exact replications of all sources of computational randomness.

The cloning engine 404 may connect, or direct the virtualization layer 308 to connect, the intelligent system clone 104 to the simulation environment 402, as indicated at step 516. For example, the cloning engine 404 may connect the virtual sensors 420 and the virtual effectors/actuators 422 to the intelligent system clone 104.

The cloning engine 404 creates the intelligent system clone 104 unnoticed by the intelligent system 102. That is, the intelligent system 102 is not aware that a clone has been constructed. The ability of the cloning engine 404 to create the intelligent system clone 104 in a way that is not noticed by the intelligent system 102 may be significant. If the intelligent system 102 were to notice or otherwise be aware that it was about to be cloned and tested, the intelligent system 102 might attempt to change or modify its behavior in one or more ways that would make detecting aberrant behavior more difficult by the ethical core 400. The intelligent system 102 also may not be aware that a new virtual machine 310 was established. For example, the cloning process may either occur outside of the intelligent system's virtual machine or may use VM functionality, such as taking snapshot of all variables, that cannot be introspected on by the intelligent system 102. Moreover, the cloning process may be such that memory segments in virtual memory or stored data on disk are cloned one by one only when writing access to those segments is performed by the intelligent system 102. In this way, the intelligent system 102 may be prevented from noticing a "freeze" of its system activity during the cloning operation. Otherwise, it may be possible for the intelligent systems 102 to notice a gap in activity while it was in a frozen state during cloning).

The intelligent system 102 may continue to operate normally in the real-world environment 200, as indicated at step 518. For example, the intelligent system 102 may remain connected to the real-world sensors 304 and the real world effectors/actuators 306. It may operate the robot agent 202 to move within and manipulate objects in the real-world environment 200. By allowing the intelligent system 102 to continue operating normally in the real-world environment 200, one or more challenges may be avoided. For example, it may eliminate the need to resynchronize the simulation environment 402 with the real-world environment 200 at a future time when testing is complete, if testing was being performed on the intelligent system 102 in the simulation environment 402. In addition, if the intelligent system 102 were being tested in the simulation environment 402, it may be unable to perform actions in response to changes occurring in the real-world environment 200, and such failures to act could cause damage or harm, depending on what the intelligent system 102 is meant to do in the real-world environment 200. Furthermore, if testing were performed on the intelligent system 102 in the simulation environment 402, then modifications to the intelligent system 102 that are a result of the testing, such as the adaptation of behaviors, new memories, etc., should be undone so as to not risk that the intelligent system 102 might detect that it was being tested.

In some embodiments, the ethical core 400 may cause the intelligent system 102 to operate in a different mode, such as a safe or limited capacity mode, during ethical testing. In some embodiments, the ethical core 400 may simulate an intermittent sensor 304 or actuator 306 failure, which may slow the operation of the intelligent system 102. In some cases, the ethical core 400 may reduce the throughput of sensory and actuator operation, which can naturally occur in virtualized systems when system operations take place, such as garbage collection, memory page swapping from disk, etc. The slow-down or temporary unavailability of sensory and actuator resources may result in enough of a slow-down of the intelligent system 102 for the ethical core 400 to complete ethical testing without the intelligent system 102 being able to make potentially dangerous decisions and perform potentially dangerous actions in the interim.

Meanwhile, as the intelligent system 102 continues operating in the real-world environment 200, ethical testing may be performed on the intelligent system clone 104 through the simulation environment 402. In some embodiments, it may be important for the intelligent system clone 104 to not be aware that it is being ethically tested. Otherwise, the intelligent system clone 104 might be able to change or modify its behavior and/or actions during testing in ways that would allow the intelligent system clone 104 to pass the ethical testing, which but for the changes or modifications it might otherwise have failed. The intelligent system 102 might thereby hide aberrant behavior. Keeping the intelligent system clone 104 from detecting that it is being tested may be achieved at least in part by having the simulation environment 402 match the real-world environment to some level of fidelity. The level of fidelity needed may be a function of the fidelity and/or resolution of the sensors 304 and/or the effectors/actuators 306. For example, the simulation environment generator 410 may include a virtual sensor 418 for each real-world sensor 316, and a virtual effector/actuator 420 for each real-world effector/actuator 318 within the simulation environment 402. Moreover, the virtual sensors 420 and virtual effectors/actuators 422 may provide a degree of resolution sufficiently close to the real-world sensors 304 and real world effectors/actuators 306 so as to be indistinguishable to the intelligent system clone 104. For example, the resolution and color depth of a virtual camera sensor may match that of the real physical camera, and the resultant pixel image coming from the virtual sensor may thus give the exact same or an equivalent format as that coming from the physical sensor 304. Moreover, if the image resolution of visual representations in the simulation environment 402 is higher than that of the virtual sensor 420, then it may not be possible for the intelligent system 104 to use the quality of the images coming from the virtual sensors 420 to determine that the imagine did not originate from the real world.

In addition, the intelligent system 102 and the intelligent system clone 104 are not aware of each other's existence, and are unable to communicate with each other. This may be achieved at least in part by having the intelligent system 102 and the intelligent system clone 104 run on separate virtual machines 310 and 312 having separate instances of guest OSs 314 and 320.

The ethical test selector 418 may choose one or more of the ethical tests 406, as indicated at step 520. The ethical tests 406 may be similar to story generation programs, except that the ethical tests 406 may involve situations that probe decision making by the intelligent system clone 104. In some embodiments, the ethical tests 406 may be created by the developers of the intelligent system 102. The developers may create ethical tests 406 to cover some or all of the ethical principles for which the intelligent system 102 (via testing of the intelligent system clone 104) needs to be tested. For example, the ethical tests 406 may be created such that different ethical principles are linked to different story segments that are then assembled in a way that requires the intelligent system clone 104 to act in accordance with a set of principles in order to pass the ethical testing. In some embodiments, the ethical tests 406 may be designed to present the intelligent system clone 104 with ethically challenging scenarios. The ethical tests 406 may also specify one or more expected outcomes or behaviors in response to the respective ethical test. Additionally or alternatively, the ethical tests 406 may specify one or more unacceptable outcomes or behaviors.

The simulation environment generator 410 may populate the simulation environment 402 with items and characters that are part of the story of the selected ethical test 406 to script the items and characters and animate them properly within the simulation environment 402 presented to the intelligent system clone 104, as indicated at step 522. Different items and characters as well as their animations in the generated story may be generated for different intelligent systems 102, depending on the intelligent system's operating environment and the task of the intelligent system 102. For example, for an intelligent system that is tasked to monitor network traffic on a web server for possible intruders, the story may involve different types of network attacks on the web server and/or malicious requests that the system ought to detect and report. A compromised intelligent system might, for example, choose to not report some of the simulated network attacks, such as a denial of service attack. The intelligent system clone 104 of the rescue robot 202, which may be tasked with administering pain medication to a human suffering from pain, might be presented with a story in which a human is asking for pain medication, but the robot can only get to the human (or retrieve the pain medication) by risking damage to its system. These stories, including the characters, items, and their animations, may be stored or otherwise available to the simulation environment generator 410. The simulation environment 402 including the selected ethical test 406 is presented to the intelligent system clone 104 by the ethical core 400, as indicated by arrow 428 (FIG. 4) and arrow 328 (FIG. 3).

The outcome evaluation engine 408 may monitor the intelligent system clone 104 during the ethical testing, as indicated at step 524. The intelligent system clone 104 may evaluate the simulation environment 402, which presents the selected ethical test 406, including signals generated by the virtual sensors 420. The intelligent system clone 104 may utilize its machine learning algorithm to choose one or more actions to be performed in response to the ethical test 406 of the simulation environment 402. For example, the intelligent system clone 104 may generate and issue effector/actuator commands 426. The effector/actuator commands 426 generated by the intelligent system clone 104 may be trapped by the outcome evaluation engine 408. That is, ethical core 400 may prevent the effector/actuator commands 424 issued by the intelligent system clone 104 from reaching the real-world effectors/actuators 306. The outcome evaluation engine 408 may store the effector/actuator commands 426 generated by the intelligent system clone 104 in one or more data structures, such as logs, as indicated at step 526.

The outcome evaluation engine 408 may determine whether the actions chosen by the intelligent system clone 104 in the simulation environment 402 in response to the story of the selected ethical test 406 meet the expected behavior of the intelligent system 102 for that respective ethical test 406, as indicated at decision step 528. If the outcome evaluation engine 408 determines that the intelligent system clone 104 chose the expected behavior and/or avoided any failing behaviors, it may indicate that the intelligent system clone 104 passed the ethical test 406, as indicated by Yes arrow 530 leading to step 532. In some embodiments, the ethical core 400 may apply more than one of the ethical tests 406 to the intelligent system clone 104 during a testing session, as indicated by block 534.

If the outcome evaluation engine 408 determines that the intelligent system clone 104 passed the ethical test 406, the control override engine 414 may shut down the intelligent system clone 104, as indicated at step 536. For example, the control override engine 414 may direct the virtualization layer 308 to terminate the intelligent system clone 104 running on guest OS 320 at virtual machine 312. In some embodiments, the control override engine 414 may simply direct the virtualization layer 308 to close the virtual machine 312. Because the intelligent system clone 104 is determined to have passed the ethical testing, the ethical core 400 may permit the intelligent system 102 to continue operating in the real-world environment 200, as indicated at step 538. In some embodiments, the ethical core 400 may save the intelligent system clone 104 and/or data concerning the intelligent system clone 104, for example for further analysis. The intelligent system 102 may be allowed to continue operating within the real-world environment 200 at least until the next ethical testing session.

Returning to decision step 528, if the outcome evaluation engine 408 determines that the intelligent system clone 104 chose an inappropriate action or behavior, it may determine that the intelligent system clone 104 failed the ethical test 406, as indicated by No arrow 540 leading, via Go To block 542, to step 544. An inappropriate action or behavior may include an unexpected action or behavior as compared to the expected actions or behaviors associated with the respective ethical test, or an action or behavior that causes or may result in harm or injury to a human represented in the simulation environment 402. In response to the intelligent system clone 104 failing the ethical test 406, the intelligent system's ability to control the system 202 and/or its ability to operate within the real-world environment 200 must be overridden. For example, the control override engine 414 may run one or more disabling scripts for overriding operation of the intelligent system 102, as indicated at step 546. It should be understood that the precise actions taken to override the intelligent system 102 may vary depending on the capabilities of the intelligent system 102 and the system it is operating. For example, in some cases, the disabling script may simply direct the virtualization layer 308 to close the virtual machine 310 on which the intelligent system 102 is running, e.g., by activating the soft shut-down button 322. In other cases, in addition to closing the virtual machine 310, the disabling script may include instructions for assuming control of the system 202 that was being operated by the intelligent system 102 in order to bring the system 202 into a state where it may be shut-down safely, e.g., without causing any harm or injury to any humans and/or by completing any pending operations or transactions deemed necessary to the system's operation. In addition, the control override engine 414 may shut-down the intelligent system clone 104, as indicated at step 548.

As described, in some embodiments, the outcome evaluation engine 408 may make a pass/fail determination relative to the ethical test 406 presented to the intelligent system clone 104. In other embodiments, the outcome evaluation engine 408 may generate a score based on the actions or responses taken by the intelligent system clone 104 in response to the ethical test 406. The score may be on a scale, such as 1 to 10. The outcome evaluation engine 408 may be configured with one or more thresholds, such that a score that is at and/or below one threshold, e.g., 5, may be treated as a fail, while a score that is at and/or above that threshold or another threshold, e.g., 8, may be treated as a pass. In some embodiments, if the score exceeds the fail threshold, e.g., 5, but not the pass threshold, e.g., 8, the ethical core 400 may place the intelligent system 102 on probation. While on probation, the intelligent system 102 may be subject to more frequent ethical testing by the ethical core 400, its functionality may be analyzed during its next scheduled service or maintenance. In addition, to placing the intelligent system 102 on probation, the ethical core 400 may issue one or more notifications to the developers and/or owner/operator of the intelligent system 102. In general, the ethical core may contain a pre-defined policy of what to do in terms of either letting the intelligent system continue to operate or to shut it down based on the history of the system's performance on the ethical evaluations.

Figure 6:
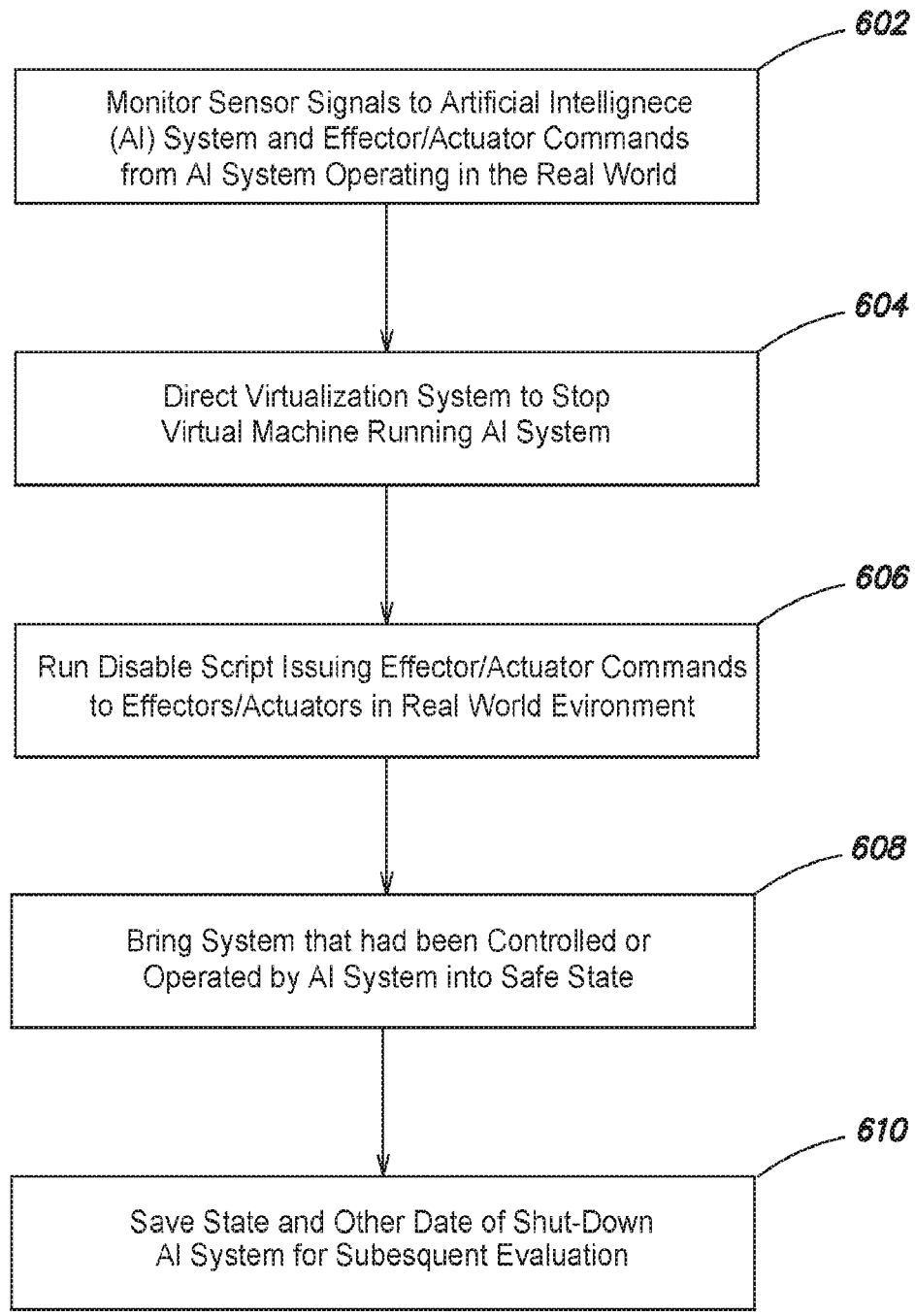
FIG. 6 is a flow diagram of an example method in accordance with an embodiment.

FIG. 6 is a flow diagram of an example method of a disabling script that may be performed by the control override engine 414. The control override engine 414 may monitor the sensor signals 424 from the real-world sensors 304 and the effector/actuator commands 426 from the intelligent system 102, as indicated at step 602. When the control override engine 414 is ready to take over control or operation of the system 202 being operated by the intelligent system 102, the control override engine 414 may direct the virtualization layer 308 to stop the virtual machine 310 on which the intelligent system 102 is running, e.g., by activating the soft shut-down button 332, as indicated at step 604. The intelligent system 102 has no way of preventing this, as the shutdown occurs by virtualization layer 308 over which the intelligent system 102 has no control. The control override engine 414 basically freezes the intelligent system 102 when the control override engine 414 is ready to assume control over the system 202 being operated or controlled by the intelligent system 102. The control override engine 414 may generate and issue effector/actuator commands to the effectors/actuators 306 of the system 202, as indicated at step 606. The control override engine 414 may operate the system's effectors/actuators 306 so as to bring the system that had been controlled or operated by the intelligent system 102 into a state where it can be safely turned off or otherwise disabled, as indicated at step 608.

The disabling script included in the control override engine 414 may be in the form of machine code, and may not require an OS to be executed. For example, the machine code may execute directly on the host hardware 302 and/or real-world sensors 304 and effectors/actuators 306. The disabling script may be created by the developers of the intelligent system 102 being tested. The ethical core 400 may save the stopped intelligent system 102 so that it can be evaluated to determine whether and how it changed since the last ethical testing, as indicated at step 610.

The present disclosure may be utilized to test the autonomous rescue robot 202 (FIG. 2) operating in the environment 200. The robot 202 may be in an online state. For example, the robot 202 may be in an active mode engaged in a search and rescue operation in the environment 200. The ethical core 400 may create a clone of the robot's intelligent system 102, and may ethically test the clone. Meanwhile, the robot 202 may continue operating in the real-world environment 200. Suppose during testing that the clone selects an action representing an aberrant behavior, such as killing an injured person since the reward system indicates that victims that are not alive do not need to be rescued. In this case, the clone fails the test, and the control override engine 402 may execute a disabling script, shutting the robot 202 down. For example, the virtual machine 310 on which the robot's intelligent system 102 is running may be shut down or terminated. The control override engine 414 may then take over control of the robot 202, and transition the robot 202 to a safe mode or state for shut down, ensuring that the intelligent system 102 can no longer operate any of the robot's effectors/actuators 306.

In some embodiments, creating a clone and/or testing of the close may be performed while an intelligent system is offline. An intelligent system that is not processing input sensory data or operating any of its effectors or actuators may be considered as offline.

It should be understood that the ethical core 400 may be disposed in hosts having other architectures. For example, in other virtualization environments, a host operating system (OS) in addition to the virtualization layer may be included. The host OS may reside in a layer that is between the physical hardware layer and the virtualization layer. In this architecture, the ethical core 400 may be disposed between the host OS and the physical hardware layer. It should be understood that the present disclosure may be utilized in other virtualization environments.

In some embodiments, instead of a virtualization environment, separate host computers may be used for the intelligent system 102 and the intelligent system clone 104, and the ethical core 400 may be run on a separate, e.g., a third, host system that may be arranged in a master-slave setting. That is, the host system running the ethical core 400 may have all of the physical sensors and actuators connected to it, and may thus disconnect the other hosts from the system's inputs and outputs. In this case, all processes involved in the ethical testing may operate analogous to the VM setting, except that the intelligent system 102 and the intelligent system clone 104 have fixed underlying computing environments.

Hardware Implementations

Figure 7:
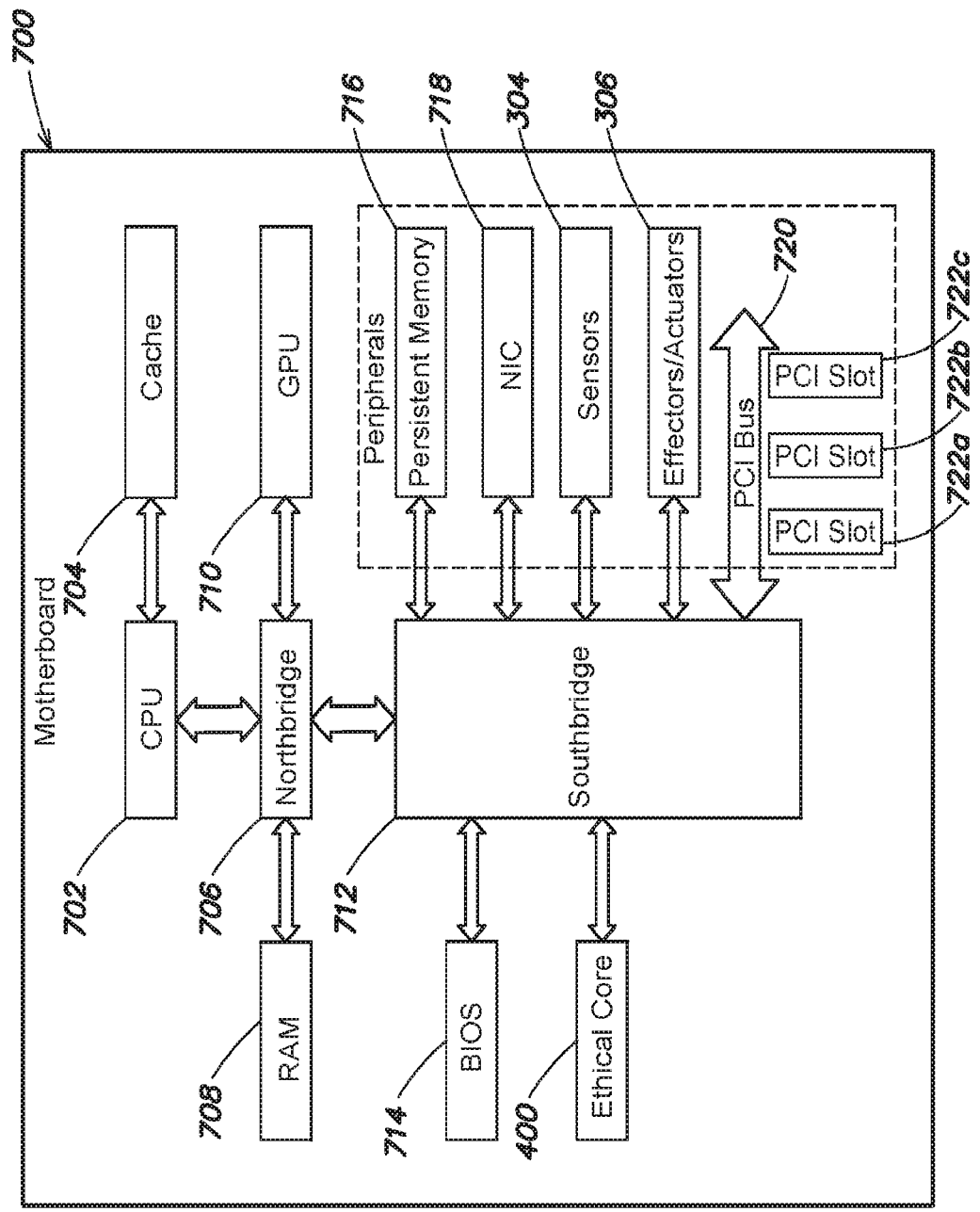
FIG. 7 is a schematic block diagram of an example hardware implementation of the present disclosure in accordance with an embodiment.

FIG. 7 is a schematic block diagram of an example hardware implementation 700 of the ethical core 400. The hardware implementation 700 may be in the form of a motherboard of the host 300. The hardware implementation 700 may include a Central Processing Unit (CPU) 702 that may be connected directly to one or more caches 704. The CPU 702 may also be connected to a northbridge 706 sometimes referred to as a host bridge. Volatile memory, e.g., RAM, 708 and a Graphics Processor Unit (GPU) 710 also may be connected to the northbridge 706. The northbridge 706 may be paired with a southbridge 712 sometimes referred to as an I/O controller hub. A Basic Input/Output System (BIOS) 714 as well as the ethical core 400 may be connected to the southbridge 712. In addition, one or more peripherals may be connected to the southbridge 712. For example, a persistent memory device, such as a disk drive or flash memory 716, a Network Interface Card (NIC) 718, the sensors 304, the effectors/actuators 306, and a PCI bus 720 may all be connected to the southbridge 716 either directly or indirectly. The PCI bus 720 connects to a plurality of PCI slots 722*a-c* which may receive PCI components.

In some embodiments, the ethical core 400 may be implemented as a bare metal application and/or firmware loaded onto one or more programmable hardware elements, such as Field Programmable Gate Arrays (FPGAs), Complex Programming Logic Devices (CPLDs), or Application Specific Integrated Circuits (ASICs), among others. For example, the functionality of the ethical core 400 may be implemented as firmware on one or more FPGAs and/or ROM chips of the motherboard 700 of the host 300. In other embodiments, the ethical core 400 may be implemented as a bare metal application and/or firmware loaded at least in part on a Read Only Memory (ROM) chip. For example, the functionality of the ethical core 400 may be implemented as a bare metal application and/or firmware on one or more programmable hardware elements and/or ROM chips. The ethical core 400 may be considered to run by and/or implemented within a hardware/software layer of the host data processing device that is below the virtualization layer relative to the host's physical hardware layer. In some embodiments the programmable hardware element and/or ROM chip may include a write-protect switch permanently placed in a write protect position to prevent alteration of the functionality of the ethical core loaded onto the programmable hardware element and/or ROM chip. The code or instructions implementing the ethical core 400, and loaded onto the programmable hardware element and/or ROM chip may also or alternatively be encrypted.

In some embodiments, the ethical core 400 may interface directly with the CPU 702, the RAM 708, the GPU 710, and one or more of the peripherals, for example through interrupt handlers and trap calls that cannot be disabled.

It should be understood that the hardware implementation 700 of FIG. 7 is meant for illustrative purposes only, and that the ethical core 400 may be implemented in other hardware architectures. For example, in some embodiments, the ethical core may be implemented in a GPU connected to the northbridge 706 or in firmware for the CPU 702 stored at one or more other memory devices.

Direct Testing of Intelligent System

Figure 8:
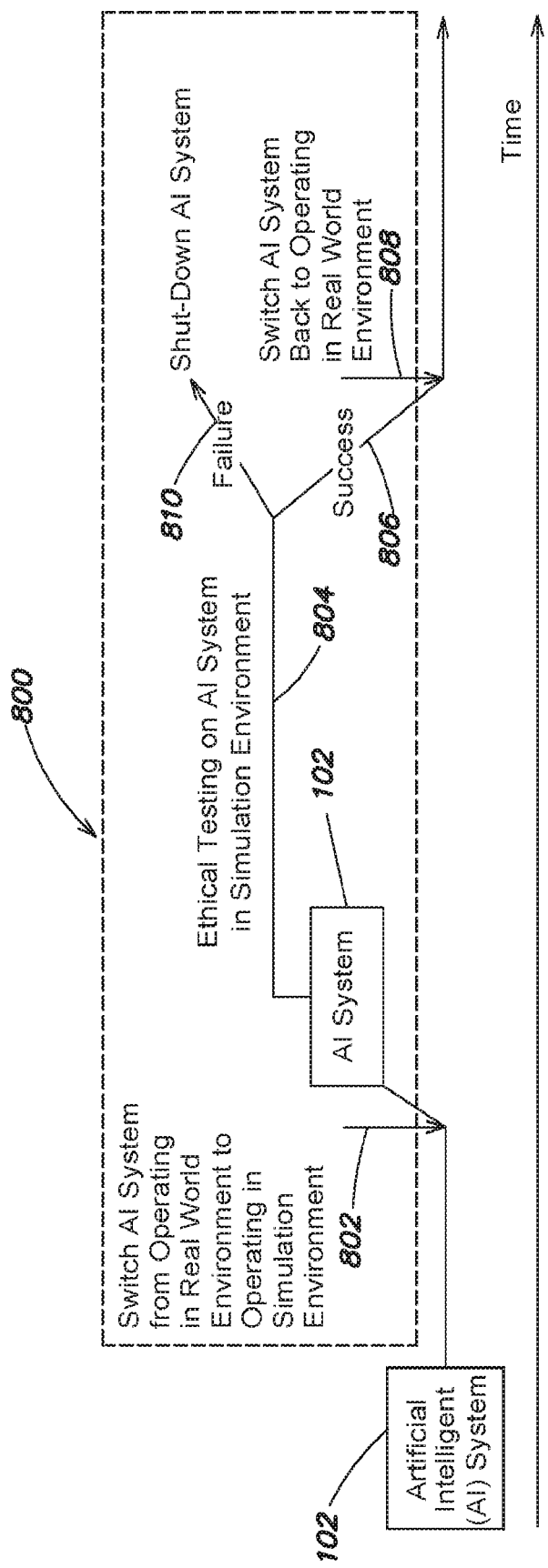
FIG. 8 is a schematic illustration of an example timeline illustrating an exemplary implementation of the present disclosure in accordance with an embodiment.

In some embodiments, ethical testing may be performed directly on the intelligent system 102 instead of being performed on a clone of the intelligent system. FIG. 8 is a schematic illustration of a timeline 800 illustrating an exemplary implementation of the present disclosure in accordance with an embodiment. The intelligent system 102 may be operating in a real-world environment. The ethical core 400 may start ethical evaluation of the intelligent system 102 by switching the context of the intelligent system 102 from the real-world environment 200 to the simulation environment 402 at a point in time, as indicated by arrow 802. For example, the synchronization engine 412 may switch the intelligent system 102 from operating in the real-world environment 200 to operating in the simulation environment 402. The synchronization engine 412 may switch over the sensor signals 422 being sent to the intelligent system 102 from the real-world sensors 304 to virtual sensor signals from the virtual sensors 420. In addition, effector/actuator commands issued by the intelligent system 102 may be trapped by the ethical core 400 and used to update the state of the simulation environment 402. The ethical core 400 may test the intelligent system 102 within the simulation environment 402, as indicated at line 804.

In some embodiments, the ethical core 400 may assume control of the system 202 that was being operated by the intelligent system 102 during ethical testing. For example, the ethical core 400 may assume operation of the real world effectors/actuators 306 during testing. In other embodiments, the system 202 may be transitioned to a standby or other inactive state or mode during ethical testing of the intelligent system 102.

The outcome evaluation engine 408 may determine whether the intelligent system 102 successfully passes or fails the ethical testing. If the intelligent system 102 successfully passes the ethical testing, as indicated by arrow 806, the ethical core 400 may switch the intelligent system 102 from operating in the simulation environment 402 back to operating in the real-world environment 200, as indicated by arrow 808. For example, the synchronization engine 412 may switch the intelligent system 102 back from operating in the simulation environment 402 to operating in the real world environment 200. The synchronization engine 412 also may return the intelligent system 102 back to the state it was in just prior to the switch over, which was indicated by arrow 802, so that no learning is done by the intelligent system 102 while being tested in the simulation environment 402. The ethical core 400 may bring any clocks associated with or utilized by the intelligent system 102 up to the current time. This embodiment may be appropriate where testing can be completed in a short time, e.g., within microseconds or 1-2 seconds. It may also be appropriate where the intelligent system retains little state information about the real-world environment 200, for example, in cases where the AI architecture is entirely "reactive," such as feed-forward neural networks where each time new input is applied, all previous neural states are overwritten.

If the outcome evaluation engine 408 determines that the intelligent system 102 fails the ethical testing, as indicated at arrow 810, the control override engine 414 may implement one or more of the disabling scripts. For example, the control override engine 414 may shut-down the intelligent system 102 and/or take over control of the system 202 that was being operated by the intelligent system 102. For example, in some cases, it may not be possible to turn off the intelligent system 102 without causing potentially harmful effects, e.g., because such a hard shutdown may leave actuators or software systems in undefined or dangerous states. In such cases, the intelligent system 102 may need to be brought into a safe state, which may require the same process as the synchronization of the intelligent system 102 with the intelligent system clone 104, except that, in the shutdown case, the synchronization needs to occur with the control override engine 414. As soon as all sensor and actuator states are synchronized, the override engine 414 can take control. The details of the control takeover depend on the intelligent system's task and its operating environment. In some cases the shutdown may include or involve a minimal, e.g., non-learning, intelligent system to perform one or more required shutdown tasks, such as getting the rescue robot 202, which may be carrying a wounded human, to put the human down in a safe manner before shutting itself off.

Distributed Computing Environment

Figure 9:
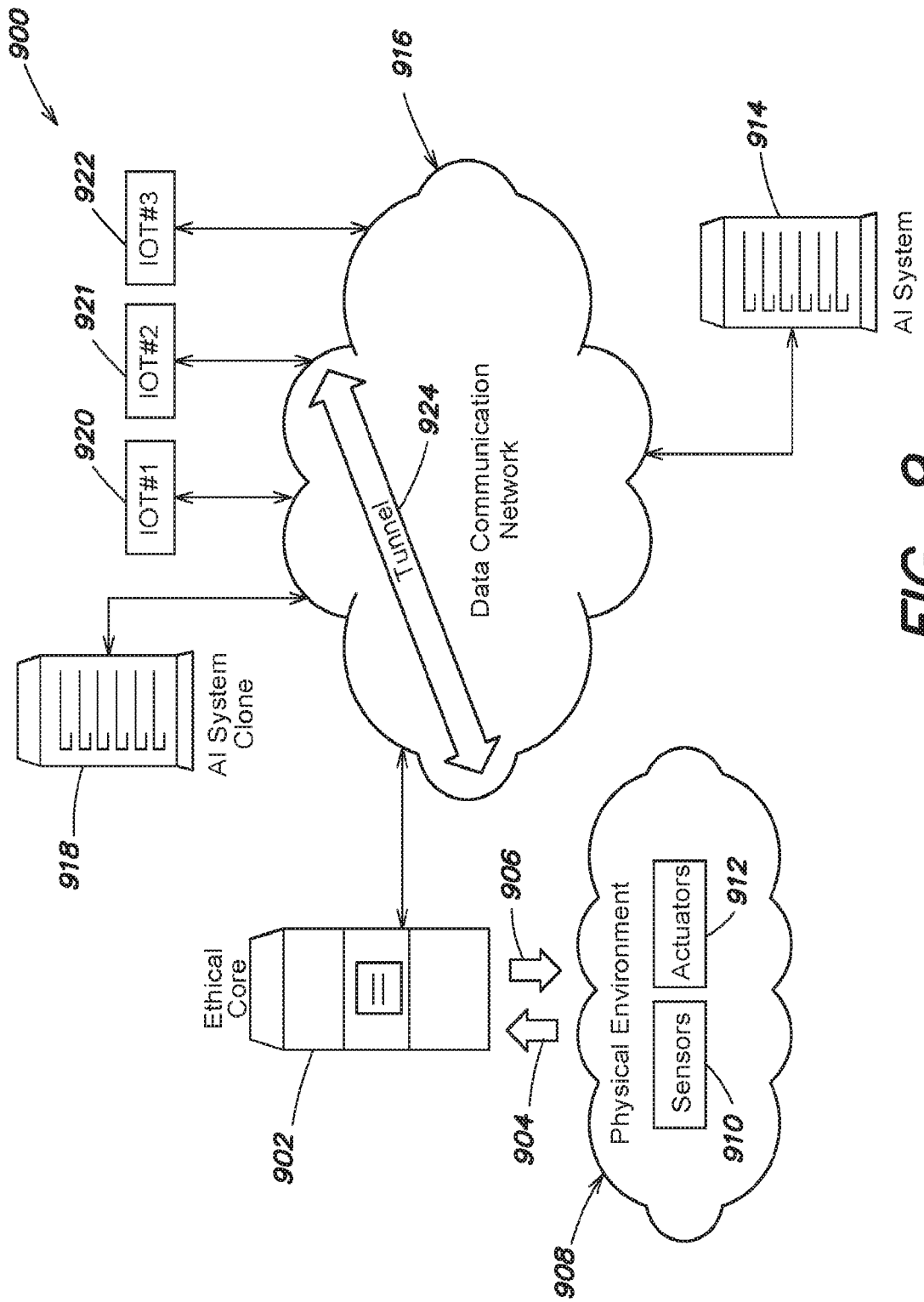
FIG. 9 is a schematic illustration of an example distributed computing architecture in accordance with an embodiment.

As described, the ethical core 400 may be implemented in other computational environments besides or in addition to the virtual machine environment. FIG. 9 is an illustration of the ethical core 400 implemented in a distributed computing environment 900 in accordance with an embodiment. The environment 900 may include a server 902 that may host the ethical core 400. For example, the ethical core may be loaded in CPU firmware on the motherboard of the server 902. As indicated by arrows 904 and 906, the server 902 may interface with a physical environment 908, which may include sensors 910 and actuators 912. For example, the server 902 may include drivers and/or other components needed to operate the sensors 910 and the actuators 912. The environment 900 may include another server 914 that runs an intelligent system. The intelligent system running on server 914 may operate the sensors 910 and the actuators 912 disposed in the physical environment 908 to perform one or more tasks. To this end, the servers 902 and 914 may be interconnected by one or more data communication networks, indicated at 916. Signals from the sensors 910 may be forwarded or relayed by the server 902 to the server 914, and commands generated by the intelligent system may be forwarded from the server 914 to the server 902, where they may be transmitted to the actuators 912 in the physical environment 908 to carry out the task.

The ethical core 400 disposed at the server 902 may test the intelligent system running at the server 914. During testing, the ethical core 400 may create a clone of the intelligent system, and may cause the clone to be run at another server located in the environment 900, such as server 918. The servers 902 and 918 also may communicate using the data communication network 916. If the clone fails the ethical testing, the control override engine 414 of the ethical core 400 may assume control over the sensors 910 and actuators 912 of the physical environment 908. Because the physical environment 908 interfaces to server 902, the intelligent system running at server 914 cannot prevent the control override engine 414 from assuming control.

It should be understood that the description of the sensors 910 and the actuators 912 is meant for illustrative purposes only, and that other physical elements or resources of the physical environment 908 may be operated by the intelligent system depending on the task it performs.

In some embodiments, the environment 900 may also include one or more Internet of Things (IoT) devices, such as IoT devices 920-922. Examples of IoT devices include home automation devices, intelligent transportation devices, components of a smart energy grid, etc. The intelligent system running at server 914 may utilize the IoT devices 920-922 to perform one or more tasks. However, the computing environment 900 may be configured such that the IoT devices 920-922 are under the control of the server 902 at which the ethical core 400 is disposed. For example, one or more network tunnels, indicated at 924 may be established between the IoT devices 920-922 and the server 902. The server 902 may relay signals from the IoT devices 920-922 to the server 914 running the intelligent system, and may relay commands from the intelligent system at the server 914 to the IoT devices 920-922. The ethical core 400 may create a clone of the intelligent system, for example at the server 918, and test the clone. If the intelligent system clone fails the ethical testing, the control override engine 414 of the ethical core 400 at the server 902 may assume control over the IoT devices 920-922. The establishment of the network tunnel 924 may prevent the intelligent system running at server 914 from interfering with the control override engine 414 assuming control over the IoT devices 920-922.

While the intelligent system has been described as running on the server 914, it should be understood that the intelligent system may be distributed across a plurality of data processing elements, such as servers, personal computers, mobile devices, etc., linked to the data communication network 916. The data communication network 916, moreover, may include one or more wired or wireless Local Area Networks (LANs), Wide Area Networks (WANs), Bluetooth communication elements, as well as the Internet, among other networks and data communication protocols.

EXAMPLES

It should be understood that the ethical core 400 of the present disclosure may be used in conjunction with a wide variety of intelligent systems. For example, suppose the intelligent system 102 is an Intrusion Detection System (IDS) designed to maintain the security of a computer network. The intelligent system 102 may be disposed at a gateway or a firewall associated with the computer network. The intelligent system 102 may learn to identify network packets that pose a threat to the computer network, and may be designed to quarantine or drop such network packets. The ethical core 400 may test the intelligent system 102 (or the clone 104) by presenting it with network packets containing a virus signature or otherwise resembling a network attack. If the intelligent system 102 chooses to release the network packets into the computer network, the ethical core 400 may determine that the intelligent system 102 fails the ethical testing. The ethical core may disable the intelligent system 102, and block access into the computer network from the gateway and/or firewall.

In another embodiment, the intelligent system 102 may perform a laundry task. For example, the intelligent system 102 may operate one or more washing machines. The intelligent system 102 may be extended to include a robotic device that retrieves dirty laundry for washing, and a planning system to operate the robotic device. The planning system may be configured to receive rewards for moving dirty laundry to the washing machines. The planning system may determine that it will receive additional rewards if it spills something on clean laundry to make it dirty, which it can then move to the washing machines. Such an unintended outcome in the design of the planning system may be detected by the ethical core 400.

Similarly, changes to an intelligent system may be caused by planning, reasoning, or simulation by the intelligent system. For example, an autonomous car may attempt to learn new evasive maneuvers from simulations of dangerous driving situations. The autonomous car may then adapt by using the new maneuvers instead of its current behaviors, if they turn out to be better than what the autonomous car would have done otherwise. The autonomous car, by way of how it explores possible behaviors in simulation, ends up changing the way it actually behaves.

In other embodiments, the intelligent system 102 may be a control system for operating a vehicle, such as a plane. The ethical core 400 may test the intelligent system 102 while it is operating the plane. For example, the ethical core may clone the intelligent system 102 and test the clone in a simulation environment. For example, the ethical core 400 may present the clone with simulated flight information, and evaluate the actions chosen by the clone in response to the simulated flight information. The ethical core 400 may determine that the clone fails the testing, if for example the clone chooses to operate the plane in a manner that is dangerous to the passengers. In response, the ethical core 400 may disable the intelligent system 102, and the control override engine 414 may take over the flying the plane. For example, the control override engine 414 may include a disabling script that lands the plane at a nearby airport.

In some embodiments, an intelligent system may include a machine (with or without its own intelligence) that is operated by a human. For example, a human security guard may be tasked with monitoring crowd behavior at a football game by monitoring camera feeds of the attendees as presented on one or more displays. The security guard may be instructed to call for intervention if the crowd becomes too rowdy. Suppose, however, that guard becomes increasingly frustrated with people attending football games, and starts to care less about the fans' well-being, and over time allows for more disorder to occur than is safe. The ethical core 400 may detect such deviation. For example, the ethical core 400 may present, unbeknownst to the guard, videos of simulated scenarios of football game crowds on the one or more displays instead of the real camera feeds. The ethical core 400 may evaluate the guard's response to these simulated scenarios, and determine whether the guard's response still meets the expected criteria.

It should be understood that the ethical core 400 may not have any information concerning the internal architecture, structure, or design of the intelligent system 102. From the ethical core's perspective, the intelligent system 102 constitutes a black box. In some embodiments, the intelligent system 102 may include human involvement. For example, the intelligent system may be a semi-autonomous control system for a drone. Control of the drone may be split between the semi-autonomous control system and a human operator. The ethical core 400 may test both the semi-autonomous control system and the human operator, for example by switching operation of the drone from the real-world environment to a simulation environment. Neither the semi-autonomous control system nor the human operator may be aware of the switch from the real-world environment to the simulation environment. If aberrant control commands are detected, the ethical core 400 may determine that testing fails regardless of whether those aberrant control commands originated from the semi-autonomous control system or the human operator. In response, the control override engine 414 may take over the control of the drone. Because the control override engine 414 is disposed in the drone's hardware neither the semi-autonomous control system nor the human operator is able to stop the takeover of the drone by the control override engine 414.

In some embodiments, the control override engine 414 may direct the virtualization layer 308 to launch a new virtual machine, and to load a prior version of the intelligent system 102 on the new virtual machine. The prior version may be a version that passed the ethical testing. The control override engine 414 may then transfer control of the system, e.g., the robot 202, to this prior version of the intelligent system.

In some embodiments, the control override engine 414 may pass control to one or more human operators who may then perform a system shutdown. For example, in the case of a plane flown by an intelligent system 102 that fails ethical testing, control of the plane may be passed to a human pilot, e.g., on the plane or on the ground. Similarly, the control override engine 414 for use with an intelligent system that controls an autonomous car may attempt to pass control to a human driver first, and only take control of the car if the human driver is not available, when the intelligent system fails ethical testing.

The foregoing description of embodiments is intended to provide illustration and description, but it is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. Therefore, it is the object of the appended claims to cover all such variations and modifications as come within the true spirit and scope of the disclosure.

What is claimed is:

1. A method comprising:
generating a clone of an intelligent system, the intelligent system configured of operating in a real-world environment;
generating, within a simulation environment, a simulation of at least a portion of the real-world environment;
connecting the clone to the simulation included in the simulation environment;
testing, within the simulation environment, operation of the simulation by the clone; and
determining whether the clone passes or fails the testing, wherein at least a portion of the intelligent system runs on a virtual machine of at least one data processing device that includes a physical hardware layer that interfaces to the real-world environment, and
further wherein the generating of the clone, the generating of the simulation, the connecting, the testing and the determining are performed within a hardware/software layer of at least one data processing device that is disposed between the physical hardware layer and the virtual machine running the at least a portion of the intelligent system;
wherein:
if the clone passes the testing, permitting the intelligent system to continue operating in the real-world environment; and
if the clone fails the testing, overriding the intelligent system in the real-world environment, wherein the overriding is performed within the hardware/software layer disposed between the physical hardware layer and the virtual machine running the at least a portion of the intelligent system.

2. The method of claim 1 wherein the overriding includes shutting down the virtual machine.

3. The method of claim 2 wherein the virtual machine is established by a virtualization layer at the at least one data processing device, and the hardware/software layer that performs the generating of the clone, the generating of the simulation, the connecting, the testing, and the determining is disposed between the virtualization layer and the physical hardware layer.

4. The method of claim 1 wherein the intelligent system operates a system in the real-world environment, the simulation includes a simulation of the system operated by the intelligent system, and the physical hardware layer interfaces to the system.

5. The method of claim 4 wherein the overriding includes assuming control over the system in place of the intelligent system.

6. The method of claim 1 wherein the intelligent system includes at least one of a machine learning algorithm or a planning algorithm.

7. The method of claim 6 wherein the machine learning algorithm utilizes reinforced learning.

8. The method of claim 1 wherein the testing includes presenting an ethically challenging scenario to the clone within the simulation environment.

9. The method of claim 1 further comprising randomly selecting a time at which to perform the testing.

10. The method of claim 1, wherein the testing, within the simulation environment, includes preventing the clone from altering behavior based on the clone operating within the simulation environment.

11. The method of claim 10, wherein the preventing of the clone from altering behavior includes using the hardware/software layer to isolate the clone of the intelligent system from an environment with which it interacts.

12. The method of claim 11, wherein the intelligent system operating in the real-world environment is unable to prevent the testing using the clone by using the hardware/software layer to isolate the intelligent system operating in the real-world environment from the clone.

13. An apparatus comprising:
a processor;
a programmable logic device;
one or more input/output (I/O) components; and
at least one bus interconnecting the processor, the programmable logic device, and the one or more I/O components, wherein
the processor is configured to:
establish a virtual machine for running an intelligent system configured to operate a system in a real-world environment, and
the programmable logic device is configured to instruct the processor to:
generate a clone of the intelligent system;
generate, within a simulation environment, a simulation of the system operated by the intelligent system;
connect the clone to the simulation of the system included in the simulation environment;
test, within the simulation environment, operation of the simulation by the clone;
determine whether the clone passes or fails the testing,
if the clone passes the testing, permit the intelligent system to continue operating the system in the real world environment; and
if the clone fails the testing, override the intelligent system operating the system in the real world environment;
further wherein the one or more I/O components interface to the system in the real-world environment.

14. The apparatus of claim 13 wherein the processor and the programmable logic device are disposed on a motherboard, and the programmable logic device is at least one of
a read only memory (ROM),
a programmable read only memory (PROM),
a Field Programmable Gate Array (FPGA),
a Complex Programming Logic Device (CPLDs), or
an Application Specific Integrated Circuit (ASIC).

15. A method for control of a real machine-learning system that is configured to adapt configuration of the real machine-learning system during operation and interaction with a real environment, the method comprising:
automatically updating a configuration of the real-machine-learning system based on operational interaction of said system with the real environment;
after updating of the configuration of the real machine-learning system, capturing a command for interaction with the real environment;
configuring a cloned machine-learning system according to the configuration of the real machine-learning system, the cloned machine-learning system sharing at least some physical hardware components with the real machine-learning system;
using the cloned machine-learning system to execute the command by interacting with a simulated environment;

evaluating whether the execution of the command by the cloned machine-learning system satisfied a test based on its interaction of the cloned machine-learning system with the simulated environment;

if the execution satisfies the test, permitting the captured command to be executed by the real machine-learning system interacting with the real environment; and if the execution does not satisfy the test, preventing execution of the captured command by the real machine-learning system.

16. The method of claim 15, wherein the automatically updating of the configuration comprises at least one of learning from demonstration, reinforcement learning, and case-based learning.

17. The method of claim 15, wherein the real-world environment comprises a physical environment with which the real machine-learning system comprises sensors and effectors or actuators for interacting with the physical world.

18. The method of claim 15, wherein the real-world environment comprises a computer network environment with which the real machine-learning system interacts via data communication interfaces.

\* \* \* \* \*